United States Patent [19]
Sill et al.

[11] Patent Number: 5,110,406
[45] Date of Patent: * May 5, 1992

[54] MANIPULATING LIQUID UNDER CONDITION OF WEIGHTLESSNESS

[75] Inventors: Karl-Hermann Sill, Salem; Harald Lenski, Ueberlingen, both of Fed. Rep. of Germany

[73] Assignee: Dornier GmbH, Friedrichshafen, Fed. Rep. of Germany

[*] Notice: The portion of the term of this patent subsequent to Apr. 21, 2009 has been disclaimed.

[21] Appl. No.: 627,650

[22] Filed: Dec. 13, 1990

[30] Foreign Application Priority Data

Dec. 13, 1989 [DE] Fed. Rep. of Germany ....... 3941099

[51] Int. Cl.$^5$ .............................................. C30B 7/00
[52] U.S. Cl. .................... 156/621; 156/600; 156/DIG. 63; 156/DIG. 93; 156/DIG. 113; 422/100; 422/245
[58] Field of Search ............... 156/600, 621, DIG. 63, 156/DIG. 93, DIG. 113; 422/100, 245

[56] References Cited

U.S. PATENT DOCUMENTS

| | | | |
|---|---|---|---|
| 4,665,034 | 5/1987 | Chandler | 422/100 |
| 4,786,471 | 11/1988 | Jones et al. | 422/100 |
| 4,886,646 | 12/1989 | Carter et al. | 156/600 |
| 4,919,899 | 4/1990 | Hermann et al. | 422/245 |

OTHER PUBLICATIONS

"Organic Crystal Growth in Low Earth Orbit"; Radcliffe et al; *Journal of Crystal Growth* 92(1988) pp. 581–590.
"Preliminary Investigations of Protein Crystal Growth Using the Space Shuttle"; DeLucas et al; *Journal of Crystal Growth* 76(1986) pp. 681–693.

Primary Examiner—Robert Kunemund
Assistant Examiner—Felisa Garrett
Attorney, Agent, or Firm—R. H. Siegemund

[57] ABSTRACT

Apparatus and method for handling liquid under conditions of weightlessness or near weightlessness includes a small tube being open at one end and closed at the other end except for a passage; normally the open end sits on an elastic nonwetting seal; the tube is moved towards and away from that seal; a plunger on a rod is movably disposed within the tube, and a liquid is kept in the space between the plunger and the open end; the rod is provided with two adjustable, spaced apart stops; and a stationary abutment limits plunger movement to range given by spacing between the stops, so that following evaporation of liquid of a drop that has formed on lift off of the tube, only the residual drop is sucked back into the tube without formation of bubbles.

5 Claims, 1 Drawing Sheet

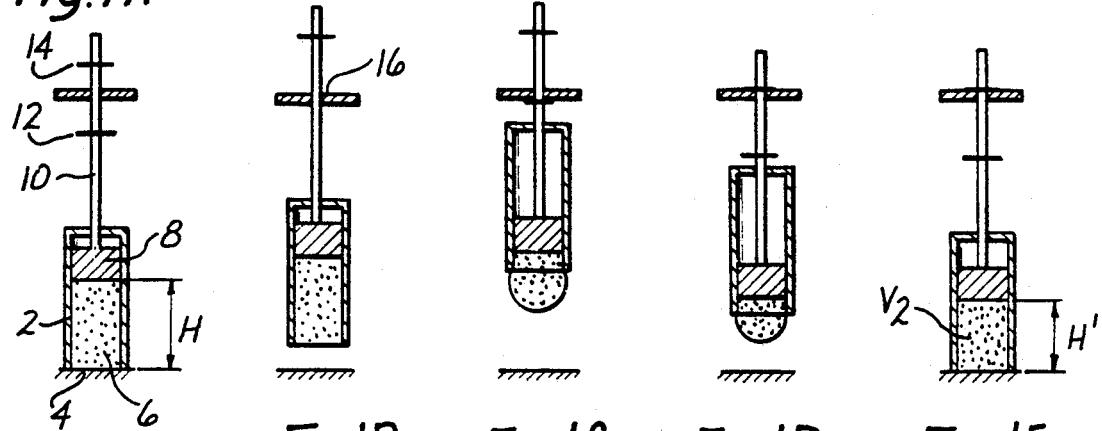
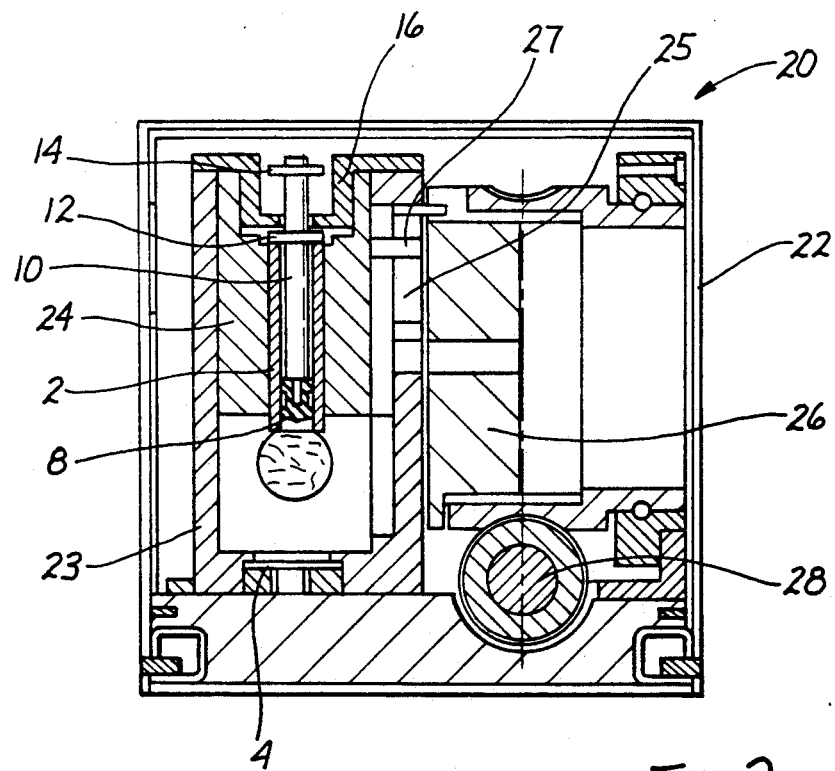

MANIPULATING LIQUID UNDER CONDITION OF WEIGHTLESSNESS

BACKGROUND OF THE INVENTION

The present invention relates to the manipulation of liquids in which crystals are grown under outer space conditions, i.e. conditions of weightlessness.

The so called hanging drop method is a method for growing crystals in a drop which is suspended on one side and has an initial volume V1 of an unsaturated solution. Some of the liquid is evaporated so that the drop assumes a smaller volume V2 in which then there is supersaturation of the solved substance and that in-turn leads to the crystallization of that substance. This method is of a general nature and it is believed that it is also usable under reduced gravitational force conditions. Moreover, if in fact an experiment along that line is carried out under zero or near zero gravity conditions, the drop that may form under this method may in fact be considerably larger and that in turn means that larger crystals can be grown.

However, contrary to an earth bound application, the method as practiced in outer space must have the following features. The initial solution has to be tightly sealed and stored in this condition prior to the beginning of the experiment. The drop should be produced as much as possible to the utmost extent (actually exclusively) without manual intervention. Following the completion of this process the liquid has to be resealed and stored safely with the grown crystalss whereby the particular liquid that remains has to fill that storage vessel completely because gas bubbles or the like have to be avoided; otherwise the crystals that have been produced in outer space could easily be destroyed on landing. Moreover, it is of course of great practical significance to have a large number of such processes conducted in a smaller space as possible as is well known space is a rare commodity in outer space experiments. The state of the art includes German patent applications 3,615,541 and 1,129,717 (the latter has a U.S. couterpart—Ser. No. 680,261, filed Aug. 26, 1957). And Journal of Crystal Growth, vol. 76 (1986) p. 681 to 693.

DESCRIPTION OF THE INVENTION

It is an object of the present invention to provide a new and improved apparatus and equipment for operating equipment yielding the formation of liquid drops under condition of actual or near weightlessness.

It is a specific object of the present invention to provide a new and improved equipment for manipulating liquid in outer space.

It is a further object of the present invention to automate the growth of crystals.

In accordance with the preferred embbodiment of the present invention it is suggested to provide a small tube being open at one end and being sealed by means of an elastic seal of low wetting capability as to the liquid in the tube and having a surface area larger than the inner diameter of the tube. The tube includes a plunger with a rod having two stops which are adjustable to assume a particular distance from each other. A stationary abutment means is provided with an opening for cooperation from opposite sides with these stops whereby the rod is passing through that opening a drive is connected with the tube and permits a vertical up and down motion of the tube in relation to the seal towards and away from it. This particular seal is preferably made of silicon rubber or polytetrafluoroethylene.

It can be seen that the inventive apparatus realizes a practicing method that includes selecting the aforementioned stops in relation to the abutment means to thereby provide for particular volumes V1 and V2. The tube containing the liquid is separated from the seal until abutting to one of the abutment stops. As the tube is continued to be moved in the same direction, liquid will be forced out of the tube by the plunger resulting in the formation of the drop in the open end of the tube. The tube then returned to move until abutting the second stop and thereafter the reduced drop volume can be sucked in to the tube at the end of the experiment without the formation of of bubbles.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 has portions 1A, 1B, 1C, 1D and 1E illustrating five different phases in practicing the mthod in accordance with the invention; and FIG. 2 illustrates the equipment in greater detail for practicing the invention.

Proceeding now to the detailed description of the drawings, FIG. 1 basically illustrates the operation of an inventive device 2 shown in detail in FIG. 2. The operation basically can be summorized in the following:

producing a particular drop at the open lower end of a tube 2; maintaining that drop for example for a certain period of time during which a crystal grows, resulting in the reduction of the volume of the drop, and subsequently the drop is sucked back into the tube 2, to occupy therein a smaller predetermined volume. The volume differential is representative of the amount of liquid that evaporated so that the tube as it is sucked back in the tube will now occupy a reduced volume space in its entirety without formation of gas bubbles or the like.

In the initial state (FIG. 1A) the tube 2 being made for example of glass is forced with its open end against an elastic disk or the like. This disk 4 acts as a seal; i.e. its main function is to offer a flat surface of a sealing characteristic, to the rim of the end of tube 2. Seal 4 is made for example of Si rubber or polytetrafluoroethylene. This kind of a material should usually be of a kind that a liquid 6 in the tube 2 is not or only minimally wetted. In the initial stage a plunger 8 within the tube 2 has been retracted from the open end of the tube 2, to permit a liquid to fill a volume given by the diameter (cross section) of the tube and the height level H. This volume is maintaned through the positioning of the plunger 8. Owing to the fact that the tube 2 is forced against the surface 4 the conditions are not only predetermined but maintained e.g. during the rough transport phase of a space vehicle launch.

The plunger is connected to a rod 10 which passes out of the otherwise closed upper end of the tube 2 and traverses an abutment disk or the like. The rod 10 is provided with two stops 12 and 14 on opposite sides of the abutment disk 16 which in effect limits the motion of the rod 10 in relation to that disk 16. This being the initial conditions it can ben seen from FIG. 1A that the position of the two stops 12 and 14 between the disk 16 permits the plunger 10 to move.

For the production of a drop the tube 2 is in some form lifted off the seal and support 4 by an arrangement which is not shown in FIG. 1 and carries along of course rod 10 with the stops 12,14. On the other hand this motion is not followed by the disk 16 so that soon the stop 12 will abut the disk 16 from below, which is the condition shown in FIG. 1B. The plunger 8 therefore does not move relative to the tube 2 during the lifting phase.

In the next phase, the stop 12 continues to abut part 16, but and as the tube 2 continues to move up the plunger 8 will slowly push liquid 6 out of the tube 2 and the desired droplet forms as can be seen in FIG. 1C. Now the operation of the experiment as such obtains and liquid material evaporates from the drop so that the total drop volume is reduced to V2.

After a certain time has elapsed in which a crystal has formed inside a drop the arrangement is moved in that the tube 2 moved back towards the particular stop surface 4. Initially the plunger 8 remains within the tube 2 as the tube 2 is moved down until the distance between stops 12 and 14 has been traversed and until the stop 14 abuts the disk 16. This condition is shown in FIG. 1D.

As now the tube 2 continues its motion towards the seal 4 the plunger 8 is moved back since the rod 10 is held through the stop 14 on disk 16. The liquid is sucked back into the tube. The distance between the two stops 12,14 and the relation to disk 16 as well as the spacing of the latter from 4 are selected so that as the tube 2 with its lower end abuts again this surface 4 all of the remaining liquid has now been sucked into the tube 2 (FIG. 1E). The plunger position is determined by a smaller height H' since V1 is larger than V2. It can readily be seen that all these conditions can very accurately be predetermined and the distance between the two stops 12 and 14 are selected accordingly.

FIG. 2 shows a device 20 for the production of the drop generally and for carrying out the method of FIG. 1. Reference numeral 2 again refers to the tube 10 is the rod and 12 and 14 are two stops on the rod 10. The disk 16 actually pertains to a potlike construction and it is held inside of housing 22 by a sleeve or container 23. Tube 2 is clamped into a holder 24 which is eccentrically connected with a drive wheel 26 by means of a pin 27. Pin 27 is held in an opening in holder 24 to permit compensation of movement transverse to the plane of the drawing. The holder 24 is a sleeve that can move up and down in the cylindrical sleeve or container 23 whose bottom includes the seal 4. Container 23 has a cut out 25 in which the pin 27 can move up and down. The wheel 26 has on the outside a helical thread which is in engagement with a thread of a drive shaft, i.e. a wormgear 28. It can readily be seen that on turning of the shaft 28 the wheel 26 rotates and that rotation is translated into an up and down movement of the tube 2. The device 16 remains stationary.

The inventive device has the advantage that there is in fact a single mechanism for opening, and closing and sealing the tube (2) containing the liquid. Owing to that single motion mechanism a drop with a total liquid volume of V1 is started with and the main aspect is that the drop is sucked back into a tube under condition which makes sure that sucking obtains only with regard to a smaller volume which takes exactly into consideration how much of the liquid has evaporated. The principal goal is the avoiding of the inclusion of gas bubbles or the like.

It can readily be seen that for example the drive 28 being a shaft that is rotated in some fashion may cooperate with a multitude of arrangements of the kind as described to establish simultaneous arrangement and operation of many devices. Presumably one can use differently large tubes and volumina for reasons of versatility.

The invention is not limited to the embodiments described above but all changes and modifications thereof, not constituting departures from the spirit and scope of the invention, are intended to be included.

We claim:

1. Apparatus for handling liquid under particular conditions of weightlessness or near weightlessness comprising:
   a small tube being open at one tube end and closed at the other end except for a passage;
   a seal of elastic property made of a low wetting material with a flat surface larger than the inner diameter of the tube so as to be incapable of entering the tube and modifying its volume;
   means for moving the tube towards and away from said seal;
   a plunger moveably disposed within said tube there being a liquid in a space between the plunger and said open end of the tube;
   a rod connected to the plunger for moving the same and traversing said passage at said other end of the tube and being outside thereof provided with two adjustably spaced apart stops; and
   stationary means for limiting abutment of the rod and of the plunger to the range given by spacing between the stops such that the plunger moves inside the tube on account of the means for moving the tube and whenever one of the stops abuts the stationary means, while the means for moving continues to move the tube.

2. Apparatus as in claim 1, said sealing device being made of silicon rubber.

3. Device as in claim 1, said sealing device beind made of polytetrafluoroethylene.

4. Method of crystal growth in drops providing the steps of
   providing a tube with a movable plunger therein, the tube being open at one end and containing a liquid and sitting flat on a sealing surface with that one end;
   lifting the tube with plunger off said surface to be spaced therefrom until a stop on the rod connected to the plunger abuts a stationary abutment;
   upon continued lifting of the tube the plunger pushing liquid out of the open end so that a drop forms at that open end;
   causing another stop of the plunger to hold the plunger in the tube while evaporation obtains of liquid and crystallization within the liquid; and
   moving the tube towards the sealing surface while the plunger is held in position so that the tube is again in sealing position, the plunger having in total moved within the tube for a limited space equivalent to the reduced volume of liquid on account of the preceding evaporation.

5. Apparatus for the manipulation of liquids particularly under zero gravity or near zero gravity conditions in space vehicles, comprising:
   movable holding means;

a container being open at one end, mounted in said holding means and moving therewith;

sealing means against which the open end of said container can abut in sealing fashion and from which it can be receded for liquid when in the container to emerge as a drop from the open end;

a plunger with rod, the plunger being movably disposed in said container, there being means in an end opposite said open end of the container through which the rod traverses;

stop means on the rod in spaced apart relationship and cooperating with abutment means for limiting a displacement stroke of the plunger in said container; and means for moving said holding means for thereby moving said container to and from said sealing means whereby, in cooperation with the abutment and the stop means, the plunger will move in the container or being held therein such that in a first phase when the container is moving off the sealing means, an open space emerges between the open end and the sealing means followed by displacement of the plunger to push a part of the liquid out of said open end for formation of a drop so that liquid can evaporate from the drop whereupon reversal of said holding means the container moves towards the sealing means with a plunger remaining in position during cooperation between the abutment and the stop means a limited retraction of the plunger occurs in the container such that the remaining liquid is fully sucked into the container when the open end of the container reengages the sealing means.

* * * * *